United States Patent
Hwang et al.

(10) Patent No.: US 8,907,320 B2
(45) Date of Patent: Dec. 9, 2014

(54) LIGHT-EMITTING DIODE FOR EMITTING ULTRAVIOLET LIGHT

(71) Applicant: Samsung Electronics Co., Ltd., Gyeonggi-do (KR)

(72) Inventors: Sung-Won Hwang, Gyeonggi-do (KR); Geun-Woo Ko, Geyonggi-Do (KR); Sung-Hyun Sim, Seoul (KR); Jung-Sub Kim, Gyeonggi-do (KR); Hun-Jae Chung, Gyeonggi-do (KR); Cheol-Soo Sone, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 24 days.

(21) Appl. No.: 13/756,241

(22) Filed: Jan. 31, 2013

(65) Prior Publication Data
US 2013/0193408 A1 Aug. 1, 2013

(30) Foreign Application Priority Data
Feb. 1, 2012 (KR) .................. 10-2012-010383

(51) Int. Cl.
| | |
|---|---|
| H01L 31/00 | (2006.01) |
| H01L 33/14 | (2010.01) |
| H01L 33/04 | (2010.01) |
| B82Y 99/00 | (2011.01) |
| B82Y 10/00 | (2011.01) |
| B82Y 20/00 | (2011.01) |
| H01L 33/20 | (2010.01) |

(52) U.S. Cl.
CPC .................. *H01L 33/04* (2013.01); *B82Y 99/00* (2013.01); *B82Y 10/00* (2013.01); *B82Y 20/00* (2013.01); *H01L 33/14* (2013.01); *Y10S 977/734* (2013.01); *H01L 33/20* (2013.01)
USPC .............................. 257/13; 257/22; 977/734

(58) Field of Classification Search
CPC .............................. H01L 33/04; H01L 33/14
See application file for complete search history.

(56) References Cited

U.S. PATENT DOCUMENTS

| | | | |
|---|---|---|---|
| 2009/0057692 A1* | 3/2009 | Lee ................................. | 257/89 |
| 2011/0127471 A1* | 6/2011 | Shin et al. .................... | 252/506 |
| 2011/0253975 A1 | 10/2011 | Shatalov et al. | |
| 2011/0266520 A1* | 11/2011 | Shur et al. ...................... | 257/13 |

FOREIGN PATENT DOCUMENTS

KR 2011-0115820 A 10/2011

* cited by examiner

*Primary Examiner* — Daniel Whalen
(74) *Attorney, Agent, or Firm* — McDermott Will & Emery LLP (57) ABSTRACT

An ultraviolet (UV) light-emitting diode including an n-type semiconductor layer, an active layer disposed on the n-type semiconductor layer, a p-type semiconductor layer disposed on the active layer and formed of p-type AlGaN, and a p-type graphene layer disposed on the p-type semiconductor layer and formed of graphene doped with a p-type dopant. The UV light-emitting diode has improved light emission efficiency by lowering contact resistance with the p-type semiconductor layer and maximizing UV transmittance.

19 Claims, 6 Drawing Sheets

PRIOR ART

LIGHT-EMITTING DIODE FOR EMITTING ULTRAVIOLET LIGHT

CROSS-REFERENCE TO RELATED APPLICATIONS

This application claims benefit to Korean Patent Application No. 10-2012-010383, filed on Feb. 1, 2012, in the Korean Intellectual Property Office, the disclosure of which is incorporated herein in its entirety by reference.

BACKGROUND

The present disclosure relates to light-emitting diodes, and more particularly, to an ultraviolet (UV) light-emitting diode for emitting UV light.

Light-emitting diodes (LEDs) are being used as a highly-efficient, environment-friendly light source in various fields, such as, displays, optical communications, automobiles, and general illumination. With the development of white light LED technology, application of LED technology to general illumination has recently attracted much attention.

The production of white light for illumination may occur by exciting red, green, and blue (RGB) phosphors by use of a UV LED as a light source. Accordingly, a need for an increase in the efficiency of a UV LED exists.

SUMMARY

The present disclosure provides an ultraviolet (UV) light-emitting diode having improved light-emission efficiency via maximization of UV transmittance.

According to an aspect of the present disclosure, a UV light-emitting diode comprises an n-type semiconductor layer, an active layer disposed on the n-type semiconductor layer, a p-type semiconductor layer disposed on the active layer and formed of p-type AlGaN, and a p-type graphene layer disposed on the p-type semiconductor layer and formed of graphene doped with a p-type dopant.

The UV light-emitting diode may be made by forming the n-type semiconductor layer on a substrate; forming the active layer on the n-type semiconductor layer; forming the p-type semiconductor layer on the active layer; and forming the p-type graphene layer on the p-type semiconductor layer.

The p-type graphene layer lowers contact resistance and maximizes UV transmittance.

To this end, the p-type graphene layer may have a transmittance of 90% or more with respect to UV light with a wavelength of 280 nm Contact resistance between the p-type graphene layer and the p-type semiconductor layer may be $10^{-4}$ ohm/cm$^2$ or less.

The p-type dopant may be at least one of $HNO_3$ and $AuCl_3$.

The p-type graphene layer may have a nanostructure. For example, a cross-section of the nanostructure may have a triangular unit structure. According to another example, a cross-section of the nanostructure may have a rectangular unit structure.

An upper surface of the p-type semiconductor layer may correspond to the nanostructure of the p-type graphene layer.

The UV light-emitting diode may further comprise a reflective layer disposed on the p-type graphene layer, the reflective layer reflecting UV light emitted from the active layer. A material used to form the reflective layer may comprise a metal.

The UV light-emitting diode may further comprise a p-type contact layer disposed between the p-type semiconductor layer and the p-type graphene layer, the p-type contact layer formed of p-GaN. A thickness of the p-type contact layer may be 20 nm or less.

The active layer may emit light having a wavelength ranging from 200 nm to 400 nm.

According to another aspect of the present disclosure, there is provided a UV light-emitting diode comprising an n-type semiconductor layer, an active layer disposed on the n-type semiconductor layer, a p-type semiconductor layer disposed on the active layer and formed of p-type AlGaN, and a p-type graphene quantum dot layer disposed on the p-type semiconductor layer and formed of graphene quantum dot doped with a p-type dopant.

An upper surface of the p-type semiconductor layer may have a nanostructure.

For example, a cross-section of the nanostructure may have a triangular unit structure. According to another example, a cross-section of the nanostructure may have a rectangular unit structure.

BRIEF DESCRIPTION OF THE DRAWINGS

Examples of the present disclosure will be more clearly understood from the following detailed description taken in conjunction with the accompanying drawings in which.

DETAILED DESCRIPTION OF THE EXAMPLES

An ultraviolet (UV) light-emitting diode according to the present disclosure will now be described more fully with reference to the accompanying drawings, in which examples of the present disclosure are shown. Like reference numerals in the drawings denote like elements, and, in the drawings, the sizes of elements may be exaggerated for clarity and convenience of explanation. Expressions such as "at least one of," when preceding a list of elements, modify the entire list of elements and do not modify the individual elements of the list.

The term "graphene" used herein refers to a polycyclic aromatic molecule having a plurality of carbon atoms covalently bonded to each other to form a two-dimensional (2D) honeycomb lattice, that is, a 2D honeycomb thin layer. The covalently bonded carbon atoms may form a 6-membered ring as a basic repeating unit, but a 5-membered ring and/or a 7-membered ring may also be formed. Accordingly, the graphene may appear as a mono-layer of covalently bonded carbon atoms (generally, sp$^2$ bond). The graphene may have various structures which are determined according to the amount of the 5-membered rings and/or 7-membered rings which may be contained in the graphene. The graphene may have a mono-layered structure or a multi-layered structure in which a plurality of mono-layers are stacked.

Figure 1:
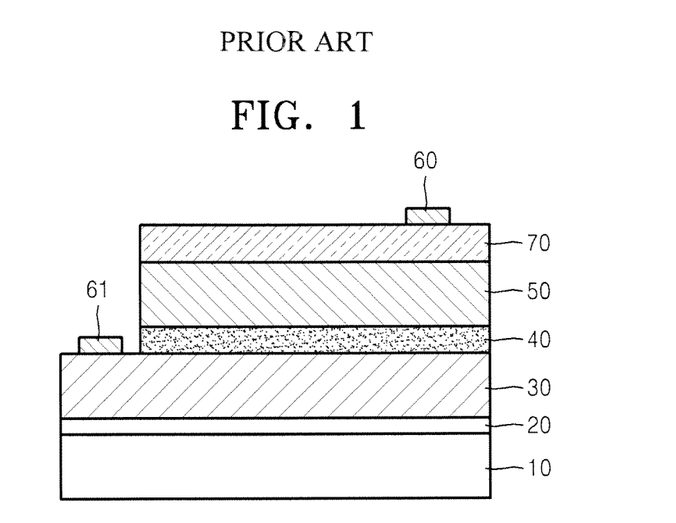
FIG. 1 is a cross-sectional view of an ultraviolet (UV) light-emitting diode of a comparative example which is to be compared with the present disclosure.

FIG. 1 is a cross-sectional view of a UV light-emitting diode of a comparative example which is to be compared with the present disclosure.

Referring to FIG. 1, a buffer layer 20, an n-type semiconductor layer 30, an active layer 40, and a p-type semiconductor layer 50 are sequentially stacked on a substrate 10. An n-type electrode 61 is connected to the n-type semiconductor layer 30 and a p-type electrode 60 is connected to the p-type semiconductor layer 50. In this case, large contact resistance may be generated between the p-type semiconductor layer 50 and the p-type electrode 60 due to a work function difference therebetween. Thus, hole implantation efficiency may be reduced.

To address this problem, a p-type contact layer 70 for lowering the contact resistance is disposed between the p-type semiconductor layer 50 and the p-type electrode 60, and a p-GaN layer may be used as the p-type contact layer 70.

Figure 2:
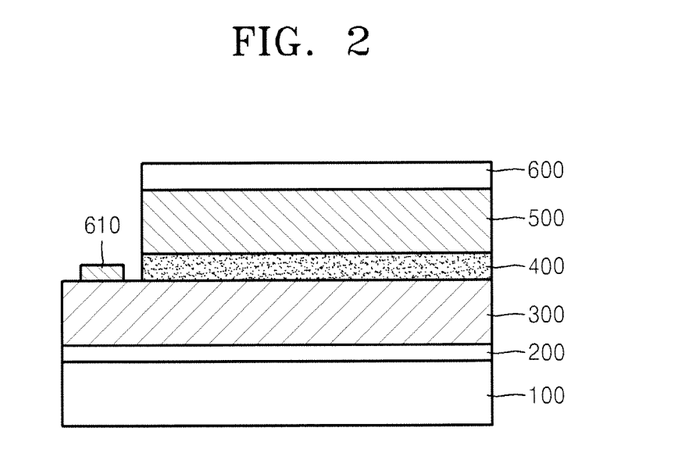
FIG. 2 is a cross-sectional view of a UV light-emitting diode according to an example of the present disclosure.

FIG. 2 is a cross-sectional view of a UV light-emitting diode according to an example of the present disclosure.

Referring to FIG. 2, a substrate 100, an n-type semiconductor layer 300, an active layer 400, a p-type semiconductor layer 500, and a p-type graphene layer 600 are illustrated. First, a basic structure of the UV light-emitting diode will be briefly described.

In the UV light-emitting diode, the n-type semiconductor layer 300, the active layer 400, and the p-type semiconductor layer 500 are sequentially stacked on the substrate 100. When a forward voltage is applied to the UV light-emitting diode, electrons in the n-type semiconductor layer 300 and holes in the p-type semiconductor layer 500 are transferred therebetween to be re-bonded with each other, and as much light as energy corresponding to the transfer of electrons and holes is emitted from the active layer 400. A light-emitting diode generates beams having different wavelengths, depending on the type and material of a semiconductor used. In order for the active layer 400 to generate light in a UV region with wavelength ranging from 200 nm to 400 nm (hereinafter, referred to as UV light), AlGaN may be used to form the n-type semiconductor layer 300 and the p-type semiconductor layer 500. In other words, a semiconductor layer formed of n-type AlGaN may be used as the n-type semiconductor layer 300, and a semiconductor layer formed of p-type AlGaN may be used as the p-type semiconductor layer 500. Hereinafter, elements of the UV light-emitting diode will be described in detail.

The substrate 100 may be a substrate 100 for semiconductor single-crystal growth, and may be formed of, for example, sapphire, Si, glass, ZnO, GaAs, SiC, $MgAl_2O_4$, MgO, $LiAlO_2$, or $LiGaO_2$. When the substrate 100 is formed of sapphire, the sapphire substrate 100 is a crystal body having Hexa-Rhombo (Hexa-Rhombo R3c) symmetry, and has a lattice constant of 13.001 Å in a c-axis direction and a lattice constant of 4.765 Å in an a-axis direction and has a C-plane (0001), an A-plane (1120), and an R-plane (1102) as sapphire orientation planes. The C-plane of the sapphire substrate 100 allows a nitride thin film to be grown thereupon relatively easily and is stable even at high temperatures, and thus it may be used as a substrate 100 for nitride growth.

The n-type semiconductor layer 300 may be formed of a semiconductor material doped with n-type impurities. As described above, the n-type semiconductor layer 300 may be formed by doping a semiconductor material having AlGaN with n-type impurities, in order for the active layer 400 to generate UV light. Examples of the n-type impurities may include Si, Ge, Se, and Te. The n-type semiconductor layer 300 may be formed by metal-organic chemical vapor deposition (MOCVD), hydride vapor phase epitaxy (HVPE), molecular beam epitaxy (MBE), or the like.

Since the n-type semiconductor layer 300 is formed of a semiconductor material having AlGaN, a buffer layer 200 may be disposed between the substrate 100 and the n-type semiconductor layer 300 in order to properly grow the n-type semiconductor layer 300 on the substrate 100. The buffer layer 200 may be formed of AlN.

The active layer 400 emits light having a predetermined amount of energy due to re-combination of the electrons with the holes. The active layer 400 may have a structure in which a quantum well layer and a barrier layer are stacked one on another by alternating with each other at least once. The quantum well layer may have a single quantum well structure or a multi-quantum well structure. Although not illustrated in FIG. 2, a superlattice structure layer may be further included in the active layer 400. The active layer 400 may be modified variously.

The p-type semiconductor layer 500 may be formed of a semiconductor material doped with p-type impurities. As described above, the p-type semiconductor layer 500 may be formed by doping a semiconductor material having AlGaN with p-type impurities, in order for the active layer 400 to generate UV light. Examples of the p-type impurities may include Mg, Zn, and Be. The p-type semiconductor layer 500 may be formed by MOCVD, HVPE, MBE, or the like.

According to the present example, the p-type graphene layer 600 is disposed on the p-type semiconductor layer 500 in order to minimize contact resistance with the p-type semiconductor layer 500 and also to maximize transmittance of emitted UV light, that is, to minimize the amount of UV light absorbed.

In the comparative example, the p-GaN layer used as the p-type contact layer 70 lowers contact resistance but sharply reduces UV light-emission efficiency because it absorbs much UV light. However, according to the present example, the p-type graphene layer 600 used instead of the p-GaN layer may reduce contact resistance and still increase UV light-emission efficiency.

According to the present example, due to the inclusion of the p-type graphene layer 600 on the p-type semiconductor layer 500, contact resistance with the p-type semiconductor layer 500 is $10^{-4}$ ohm/cm$^2$ or less, and transmittance of UV light with a wavelength of 280 nm is 90% or more.

Graphene is a conductive material that has carbon atoms arranged in a 2D honeycomb lattice and has a thickness of a single atomic layer, for example, a thickness of about 0.34 nm. Graphene is structurally and chemically stable and an excellent conductor, has a charge mobility about 100 times higher than that of silicon, and may allow about 100 times greater current to flow compared to copper. In addition, graphene has high transparency, for example, transparency higher than indium tin oxide (ITO) used as a transparent electrode.

Figure 3:
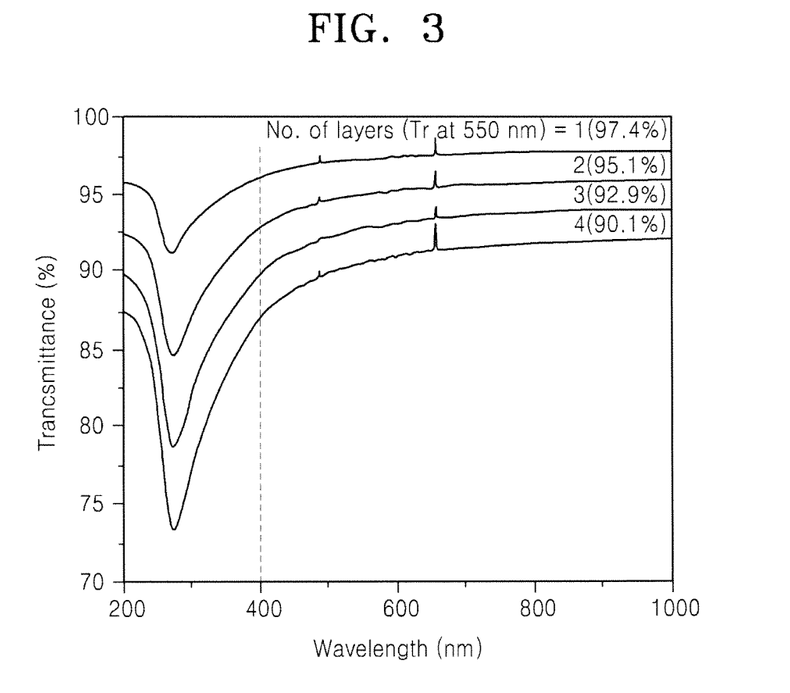
FIG. 3 is a graph of transmittance of graphene versus the wavelength of light.

FIG. 3 is a graph of transmittance of graphene versus the wavelength of light. As can be seen in FIG. 3, the transmittance of graphene is 90% or greater at most wavelengths. The transmittance of graphene somewhat decreases in a UV region with wavelength ranging from 200 nm to 400 nm, but is still relatively high as compared to other conductors. For example, a single layer of graphene has a transmittance of 90% or more with respect to UV light at a wavelength of 280 nm. In most materials, the UV light transmittance rapidly drops compared to the transmittance of visible light. For example, p-GaN, which is used to form the p-type contact layer 70 in the comparative example of FIG. 1, has a UV light transmittance which rapidly drops as compared to visible light transmittance.

Since doping of graphene with a p-type dopant enables adjustment of the work function of the p-type graphene layer 600, the contact resistance with the p-type semiconductor layer 500 formed of AlGaN may be minimized Examples of the p-type dopant may include $HNO_3$, $AuCl_3$, and the like.

Figure 4:
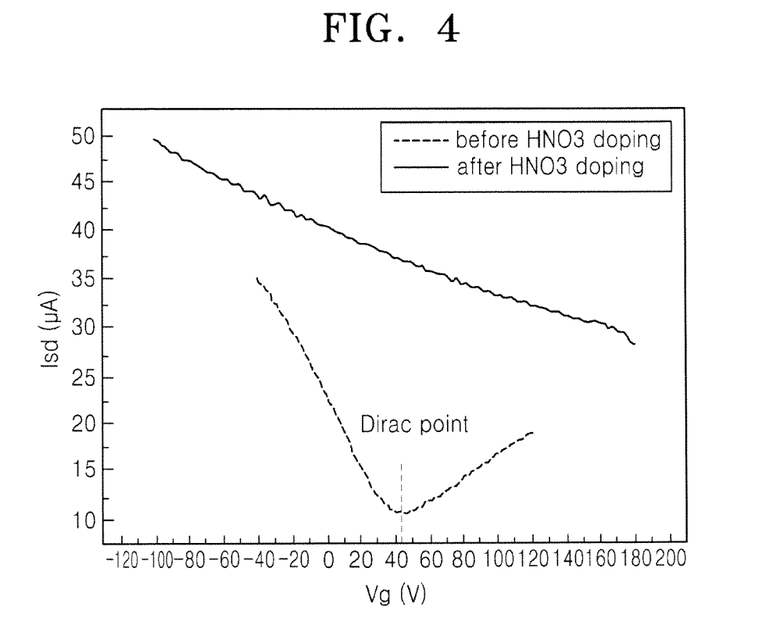
FIG. 4 is a graph showing a result of an experiment of electrical characteristics depending on whether graphene is doped with a p-type dopant.

FIG. 4 is a graph showing a result of an experiment of electrical characteristics depending on whether graphene is doped with a p-type dopant.

In this experiment, electrical characteristics of undoped graphene and graphene doped with $HNO_3$ as a p-type dopant were measured. Referring to FIG. 4, a Dirac point of the p-type doped graphene was moved by at least 150 V or more in a positive direction, compared to that of the undoped graphene. Accordingly, it can be seen that the p-type doped graphene has p-type conductivity and that the work function of the p-type doped graphene is properly adjusted. Accordingly, even when p-type graphene having high UV transmittance is used instead of a p-GaN layer, contact resistance with the p-type semiconductor layer 500 formed of p-AlGaN may be reduced to $10^{-4}$ ohm/cm$^2$ or less since the adjustment of the work function of the p-type graphene is smooth.

Figure 5:
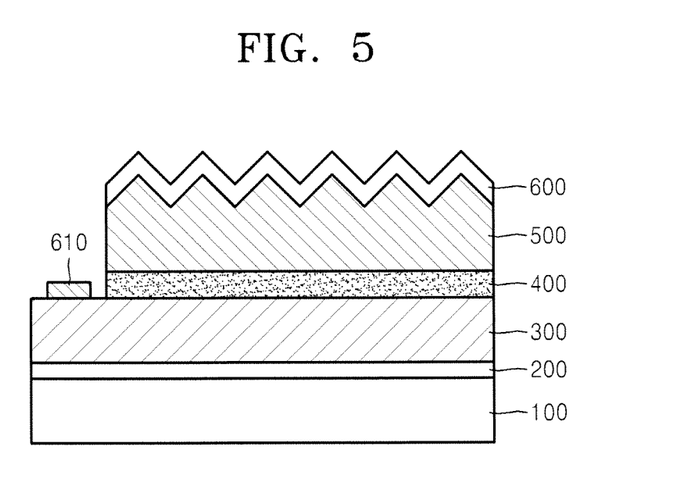
FIGS. 5 and 6 are cross-sectional views of a UV light-emitting diode including a nano-structured p-type graphene layer, according to an example of the present disclosure.
Figure 6:
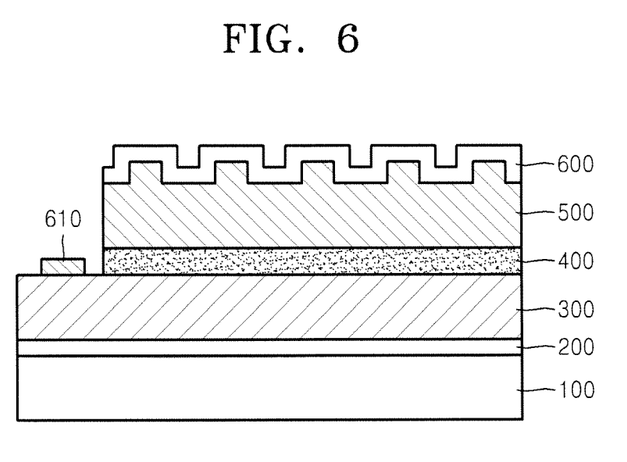

FIGS. 5 and 6 are cross-sectional views of a UV light-emitting diode including a p-type graphene layer 600 having a nano-structure, according to an example of the present disclosure.

According to the present example, the UV light-emitting diode includes the n-type semiconductor layer 300, the active layer 400, the p-type semiconductor layer 500, and the p-type graphene layer 600. The p-type graphene layer 600 may have a nanostructure. The p-type graphene layer 600 having a nano-structure diversifies an incidence angle, thus preventing light-emission efficiency from being reduced due to total reflection. When light is propagated from a material with a small refractive index to a material with a large refractive index and an angle at which light is incident upon an interface between the two materials is greater than a critical angle, the light may be totally reflected by the interface and fails to propagate to the material with a large refractive index. This property of light being totally reflected by the interface is referred to as total reflection. Since the UV light-emitting diode according to the present example diversifies the incidence angle by using the p-type graphene layer 600 having a nano-structure, it prevents the occurrence of total reflection, thereby enabling light generated in the active layer 400 to be emitted to the outside of the UV light-emitting diode. In other words, UV light generated in the active layer 400 may be emitted to the outside of the UV light-emitting diode via the nano-structure of the p-type graphene layer 600.

The nanostructure of the p-type graphene layer 600 may have any shape as long as it diversifies the incidence angle of the UV light generated in the active layer 400. According to an example, a cross-section of the nanostructure of the p-type graphene layer 600 may have a triangular unit structure, as illustrated in FIG. 5. According to another example, a cross-section of the nanostructure of the p-type graphene layer 600 may have a rectangular unit structure, as illustrated in FIG. 6.

Figure 7:
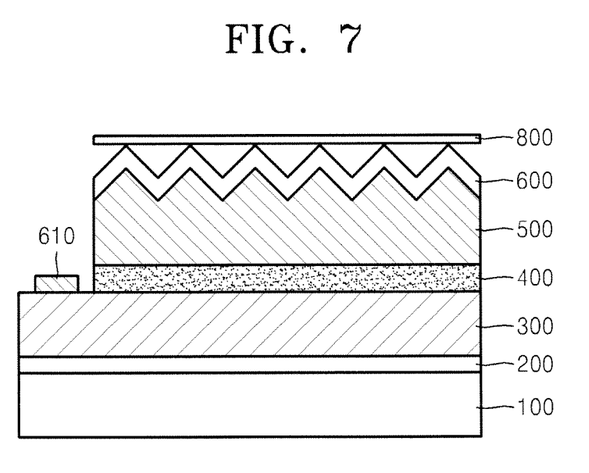
FIGS. 7 and 8 are cross-sectional views of a UV light-emitting diode including a reflective layer, according to an example of the present disclosure.
Figure 8:
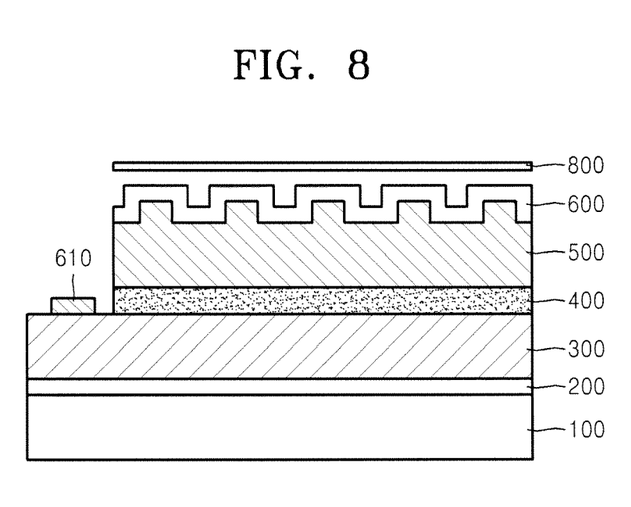

FIGS. 7 and 8 are cross-sectional views of a UV light-emitting diode including a reflective layer 800, according to an example of the present disclosure.

According to the present example, the ultraviolet light-emitting diode may further include the reflective layer 800 on the p-type graphene layer 600. The reflective layer 800 disposed on the p-type graphene layer 600 may change the direction of UV light emitted from the active layer 400.

The UV light emitted from the active layer 400 is typically directed toward the p-type semiconductor layer 500, but the disposition of the reflective layer 800 on the p-type semiconductor layer 500 may allow the UV light to be directed toward the n-type semiconductor layer 300, which is opposite to the p-type semiconductor layer 500.

Since the reflective layer 800 is arranged on the p-type graphene layer 600 serving as a transparent electrode, it may include a metallic material in consideration of conductivity.

According to the present example, the p-type graphene layer 600 may have a nanostructure as in the example of FIGS. 5 and 6. The p-type graphene layer 600 having a nano-structure may contribute to increasing light-emission efficiency, and the reflective layer 800 disposed on the p-type graphene layer 600 may change the direction in which UV light is emitted.

Figure 9:
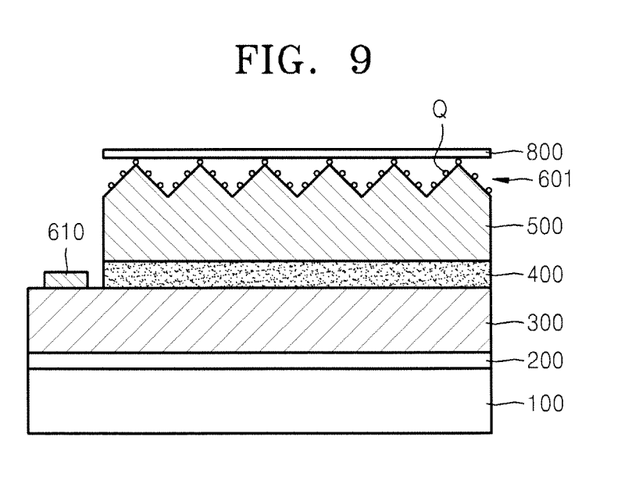
FIGS. 9 and 10 are cross-sectional views of a UV light-emitting diode according to another example of the present disclosure.
Figure 10:
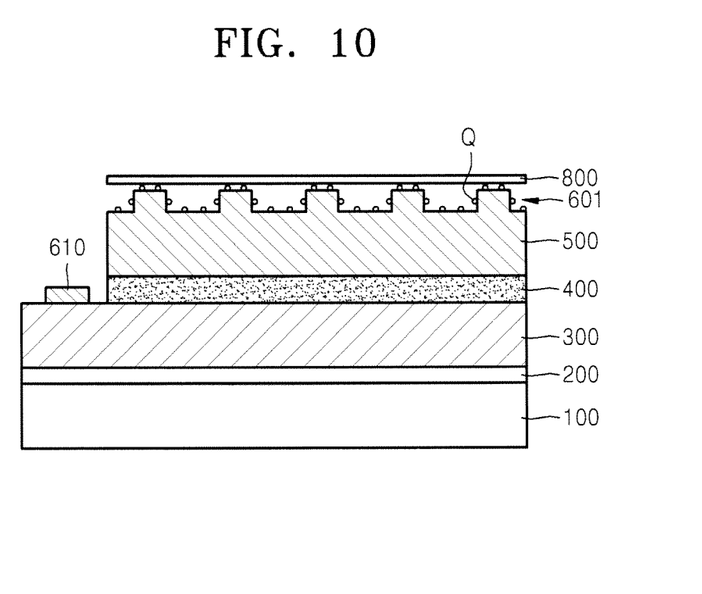

FIGS. 9 and 10 are cross-sectional views of a UV light-emitting diode according to another example of the present disclosure.

Referring to FIGS. 9 and 10, in the UV light-emitting diode, the n-type semiconductor layer 300, the active layer 400, and the p-type semiconductor layer 500 are stacked, and a p-type graphene quantum dot layer 601 formed of graphene quantum points Q doped with a p-type dopant, instead of the p-type graphene layer 600, may be disposed on the p-type semiconductor layer 500. The p-type graphene quantum point layer 601 may contribute to increasing UV transmittance and obtaining light amplification.

Each graphene quantum dot Q denotes a graphene piece having a nano-unit crystal structure of a sample with a three-dimensional size that is smaller than the dimension of a de Broglie's wavelength. The graphene quantum dot Q has a large number of electrons therein, but the number of free electrons included therein may be limited to 1 to about 100. In this case, since the energy levels of the electrons are discontinuously restricted, the graphene quantum dot Q may have different electrical and optical characteristics from a graphene sheet that forms a continuous band. Since the graphene quantum dot Q has different energy levels according to different sizes of the graphene quantum dot Q, the size of the graphene quantum dot Q may be adjusted to control a bandgap. In other words, the wavelength of emitted light may be controlled by simply controlling the sizes of the graphene quantum dot Q. In addition, since each graphene quantum dot Q has very high state densities of electrons and holes on a bandgap edge compared to the graphene sheet, many excited electrons and holes are combined with one another, thus enabling an increase of light-emission efficiency.

Moreover, by controlling the work functions of the graphene quantum dot Q through adjustment of the amount of a p-type dopant to be doped in the graphene quantum dot Q, contact resistance between the graphene quantum dot layer 601 and the p-type semiconductor layer 500 may be minimized In this case, an upper surface of the p-type semiconductor layer 500 may have a nanostructure. The p-type semiconductor layer 500 having the nano-structured upper surface diversifies an angle at which the UV light emitted from the active layer 400 is incident upon the upper surface of the p-type semiconductor layer 500, thus preventing the occurrence of total reflection.

According to the present example, the ultraviolet light-emitting diode may further include the reflective layer 800 disposed on the p-type graphene quantum dot layer 601. The reflective layer 800 may direct UV light amplified by the p-type graphene quantum dot layer 601 toward the n-type semiconductor layer 300.

Figure 11:
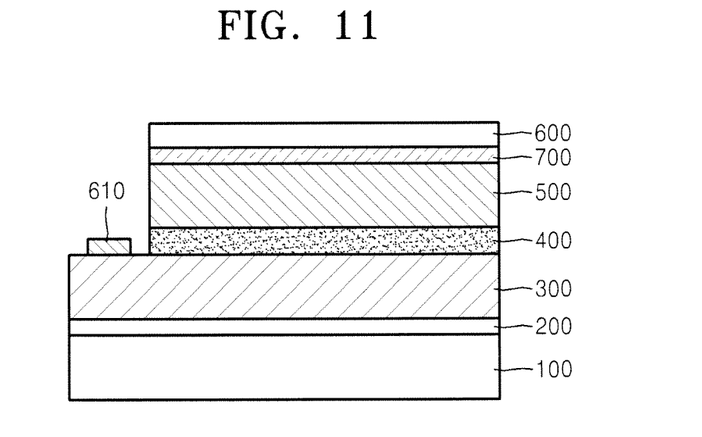
FIG. 11 is a cross-sectional view of a UV light-emitting diode according to another example of the present disclosure.

FIG. 11 is a cross-sectional view of a UV light-emitting diode according to another example of the present disclosure.

Referring to FIG. 11, the UV light-emitting diode includes the n-type semiconductor layer 300, the active layer 400, the p-type semiconductor layer 500, and the p-type graphene layer 600, and may further include a p-type contact layer 700 between the p-type graphene layer 600 and the p-type semiconductor layer 500. Since the n-type semiconductor layer 300, the active layer 400, the p-type semiconductor layer 500, and the p-type graphene layer 600 except for the p-type contact layer 700 are substantially the same as those in the previous examples, a detailed description thereof is omitted.

A p-GaN layer is used as the p-type contact layer 700 in order to minimize contact resistance with the p-type semiconductor layer 500, but the p-GaN layer may be formed as thinly as possible, considering the UV transmittance and the cost of p-GaN. The p-GaN layer may be formed to have a thickness of 20 nm or less.

While the present disclosure has been particularly shown and described with reference to examples thereof, it will be understood that the examples should be considered in a descriptive sense only and not used for purposes of limitation. For example, the reflective layer 800 may be disposed on the graphene quantum dot layer 601, and an n-type electrode 610 may be disposed in the shape of a layer between the substrate 100 and the n-type semiconductor layer 300. It will also be understood by one of ordinary skill in the art that various changes in form and details may be made in these examples without departing from the spirit and scope of the following claims.

What is claimed is:

1. An ultraviolet (UV) light-emitting diode comprising:
an n-type semiconductor layer;
an active layer disposed on the n-type semiconductor layer;
a p-type semiconductor layer disposed on the active layer and formed of p-type AlGaN; and
a p-type graphene layer disposed on the p-type semiconductor layer and formed of graphene doped with a p-type dopant,
wherein the p-type graphene layer has a nanostructure.

2. The UV light-emitting diode of claim 1, wherein the p-type graphene layer is configured to lower contact resistance and maximize UV transmittance.

3. The UV light-emitting diode of claim 2, wherein the p-type graphene layer has a transmittance of 90% or more with respect to UV light with a wavelength of 280 nm.

4. The UV light-emitting diode of claim 2, wherein contact resistance between the p-type graphene layer and the p-type semiconductor layer is $10^{-4}$ ohm/cm$^2$ or less.

5. The UV light-emitting diode of claim 2, wherein the p-type dopant is at least one of $HNO_3$ and $AuCl_3$.

6. The UV light-emitting diode of claim 2, further comprising a reflective layer disposed on the p-type graphene layer, the reflective layer configured to reflect UV light emitted from the active layer.

7. The UV light-emitting diode of claim 6, wherein a material used to form the reflective layer comprises a metal.

8. The UV light-emitting diode of claim 1, wherein a cross-section of the nanostructure has a triangular unit structure.

9. The UV light-emitting diode of claim 1, wherein a cross-section of the nanostructure has a rectangular unit structure.

10. The UV light-emitting diode of claim 1, wherein an upper surface of the p-type semiconductor layer corresponds to the nanostructure of the p-type graphene layer.

11. An ultraviolet (UV) light-emitting diode comprising:
an n-type semiconductor layer;
an active layer disposed on the n-type semiconductor layer;
a p-type semiconductor layer disposed on the active layer and comprising p-type AlGaN; and
a p-type graphene quantum dot layer disposed on the p-type semiconductor layer and comprising a graphene quantum dot doped with a p-type dopant.

12. The UV light-emitting diode of claim 11, wherein an upper surface of the p-type semiconductor layer has a nanostructure.

13. The UV light-emitting diode of claim 12, wherein a cross-section of the nanostructure has a triangular unit structure.

14. The UV light-emitting diode of claim 12, wherein a cross-section of the nanostructure has a rectangular unit structure.

15. The UV light-emitting diode of claim 11, further comprising a reflective layer disposed on the p-type graphene quantum dot layer, the reflective layer configured to direct UV light amplified by the p-type graphene quantum dot layer toward the n-type semiconductor layer.

16. The UV light-emitting diode of claim 15, wherein a material used to form the reflective layer comprises a metal.

17. The UV light-emitting diode of claim 11, wherein the graphene quantum dot is a plurality of graphene quantum dots, each having a nano-unit crystal structure of a sample with a three-dimensional size that is smaller than the dimension of a de Broglie's wavelength.

18. The UV light-emitting diode of claim 17, wherein each graphene quantum dot includes 1 to 100 free electrons.

19. The UV light-emitting diode of claim 17, wherein the plurality of graphene quantum dots include graphene quantum dots having different sizes.

* * * * *